(12) United States Patent
Taniguchi

(10) Patent No.: US 10,098,244 B2
(45) Date of Patent: Oct. 9, 2018

(54) IMAGE DISPLAY APPARATUS AND IMAGE DISPLAY APPARATUS MANUFACTURING METHOD

(71) Applicant: JOLED INC., Tokyo (JP)

(72) Inventor: Yoshihiro Taniguchi, Tokyo (JP)

(73) Assignee: JOLED INC., Tokyo (JP)

( * ) Notice: Subject to any disclaimer, the term of this patent is extended or adjusted under 35 U.S.C. 154(b) by 97 days.

(21) Appl. No.: 15/127,928

(22) PCT Filed: Dec. 22, 2014

(86) PCT No.: PCT/JP2014/006361
§ 371 (c)(1),
(2) Date: Sep. 21, 2016

(87) PCT Pub. No.: WO2015/145510
PCT Pub. Date: Oct. 1, 2015

(65) Prior Publication Data
US 2017/0094813 A1    Mar. 30, 2017

(30) Foreign Application Priority Data
Mar. 26, 2014    (JP) .................................. 2014-064664

(51) Int. Cl.
*G02F 1/1333*    (2006.01)
*H05K 5/00*    (2006.01)
(Continued)

(52) U.S. Cl.
CPC ..... *H05K 5/0017* (2013.01); *G02F 1/133308* (2013.01); *H01L 51/5237* (2013.01); *H05K 5/0217* (2013.01); *H01L 2251/558* (2013.01)

(58) Field of Classification Search
CPC ................ H05K 5/0017; H05K 5/0217; H01L 51/5237; H01L 2251/558; G02F 1/133308
See application file for complete search history.

(56) References Cited

U.S. PATENT DOCUMENTS 6,480,245 B1    11/2002  Sakamoto et al.
7,460,194 B2    12/2008  Tsukamoto
(Continued)

FOREIGN PATENT DOCUMENTS

JP    64-029624    2/1989
JP    2006-162985    6/2006
(Continued)

OTHER PUBLICATIONS

Office Action issued in Japan Patent Appl. No. JP 2016-509619 dated Jul. 25, 2017.
(Continued)

*Primary Examiner* — Charles Chang
(74) *Attorney, Agent, or Firm* — Greenblum & Bernstein, P.L.C.

(57) ABSTRACT

An image display apparatus includes: a display unit which includes a display panel that displays an image on a front face, and a chassis disposed on a back face of the display panel and holding the display panel; and a first frame member disposed along at least a portion of a front periphery of the display panel, wherein the first frame member includes: a front portion disposed on the front face of the display panel; and a folding portion connected to the front portion, and having an end portion which is disposed at a back face side of the chassis by being bent, the end portion being a distal end portion relative to the front portion.

10 Claims, 10 Drawing Sheets

(51) Int. Cl.
*H01L 51/52* (2006.01)
*H05K 5/02* (2006.01)

(56) References Cited

U.S. PATENT DOCUMENTS

| | | |
|---|---|---|
| 2006/0087804 A1 | 4/2006 | Tsukamoto |
| 2009/0067112 A1* | 3/2009 | Takabayashi ........ G02F 1/13452 361/220 |
| 2012/0002129 A1 | 1/2012 | Azai |
| 2013/0155346 A1* | 6/2013 | Li ..................... G02F 1/133308 349/58 |
| 2014/0307196 A1* | 10/2014 | Lin ................... G02F 1/133308 349/58 |
| 2014/0362328 A1* | 12/2014 | Kuroki ............. G02F 1/133308 349/58 |

FOREIGN PATENT DOCUMENTS

| | | |
|---|---|---|
| JP | 2008-009164 | 1/2008 |
| JP | 2008-116523 | 5/2008 |
| JP | 2010-181432 | 8/2010 |
| JP | 2012-014000 | 1/2012 |
| WO | 2000/058778 | 10/2000 |
| WO | 2004/111977 | 12/2004 |
| WO | 2007/083500 | 7/2007 |

OTHER PUBLICATIONS

International Search Report (ISR) in International Pat. Appl. No. PCT/JP2014/006361, dated Mar. 24, 2015.

* cited by examiner

IMAGE DISPLAY APPARATUS AND IMAGE DISPLAY APPARATUS MANUFACTURING METHOD

TECHNICAL FIELD

The present disclosure relates to an image display apparatus which includes a display panel such as an organic electroluminescent (EL) display panel.

BACKGROUND ART

An image display apparatus such as a TV includes a display panel such as a liquid crystal display panel or an organic electroluminescent (EL) display panel.

A frame member called, for example, an escutcheon or a bezel is disposed along the front periphery of the display panel.

Patent Literature (PTL) 1 discloses a panel which displays an image, a chassis which supports a panel at the front, a plurality of circuit boards fixed on a back face of the chassis, and a front cover and a back cover between which the above elements are housed. The front cover also serves as an escutcheon which covers the edges of an image display face of the panel.

The image display apparatus adopts a structure for reducing a rise in the temperature due to the panel achieving higher definition, by fully utilizing natural convection through a vent provided in the back cover.

CITATION LIST

Patent Literature

[PTL 1] Japanese Unexamined Patent Application Publication No. 2008-9164

SUMMARY OF INVENTION

Technical Problem

The present disclosure provides an image display apparatus which includes a slimmer frame than that of a conventional apparatus.

Solution to Problem

An image display apparatus according to the present disclosure includes: a display unit which includes a display panel that displays an image on a front face, and a chassis disposed on a back face of the display panel and holding the display panel; and a first frame member disposed along at least a portion of a front periphery of the display panel, wherein the first frame member includes: a front portion disposed on the front face of the display panel; and a folding portion connected to the front portion, and having an end portion which is disposed at a back face side of the chassis by being bent, the end portion being a distal end portion relative to the front portion.

Advantageous Effects of Invention

An image display apparatus according to the present disclosure includes a slimmer frame than that of a conventional apparatus. Accordingly, this achieves, for example, an increase in proportion of an image display area of the image display apparatus in front view.

DESCRIPTION OF EMBODIMENTS

The inventor of the present application has found that a conventional image display apparatus has the following problems.

For the conventional image display apparatus, when a frame member called, for instance, a bezel is attached to a display panel, an embossed portion provided on a frame member and positioned further outward than the display panel and an attaching member disposed on an edge portion of a chassis on the back face of the display panel are fastened with a screw, for example.

For example, there is also a case where a frame member is fixed to an attaching member disposed on an edge portion of a chassis with a screw inserted, parallel to a display face (front face) of a display panel, from the outer face of the frame member.

In either case, the display panel has, on an outer edge, an element, such as an embossed portion or a screw, for fixing the position of the frame member relative to the display panel. Accordingly, the presence of such an element makes it difficult to achieve a slim frame (bezel).

The present disclosure has been conceived based on such experiences, and the inventor of the present application has obtained, as a result of diligent examination, an idea for a structure of an image display apparatus which includes a slim frame.

The following describes embodiments with reference to the drawings as appropriate. An excessively detailed description may be omitted, however. For example, a detailed description of a matter already known well and a redundant description of substantially the same configuration may be omitted. This is intended to prevent the following description from being unnecessarily redundant, and to facilitate the understanding of persons skilled in the art.

Note that the inventor of the present application provides the accompanying drawings and the following description in order that persons skilled in the art sufficiently understand the present disclosure, and does not intend to limit the disclosed subject matter of the claims by these.

The following describes an embodiment and variations thereof, with reference to FIGS. 1 to 13. First, a schematic configuration of an image display apparatus according to an embodiment is described, with reference to FIGS. 1 and 2.

1-1. Schematic Configuration of Image Display Apparatus

Figure 1:
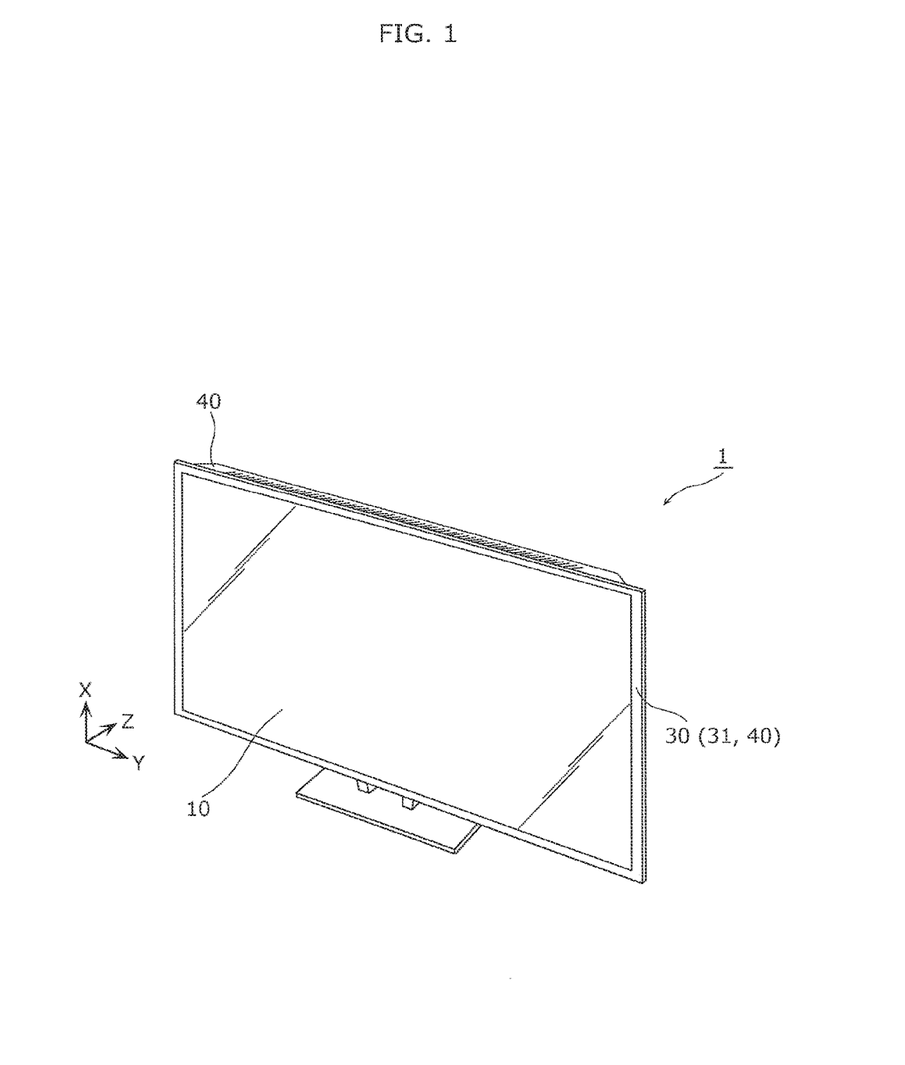
FIG. 1 is an external perspective view of an image display apparatus according to an embodiment.

FIG. 1 is an external appearance perspective view of an image display apparatus 1 according to an embodiment.

Figure 2:
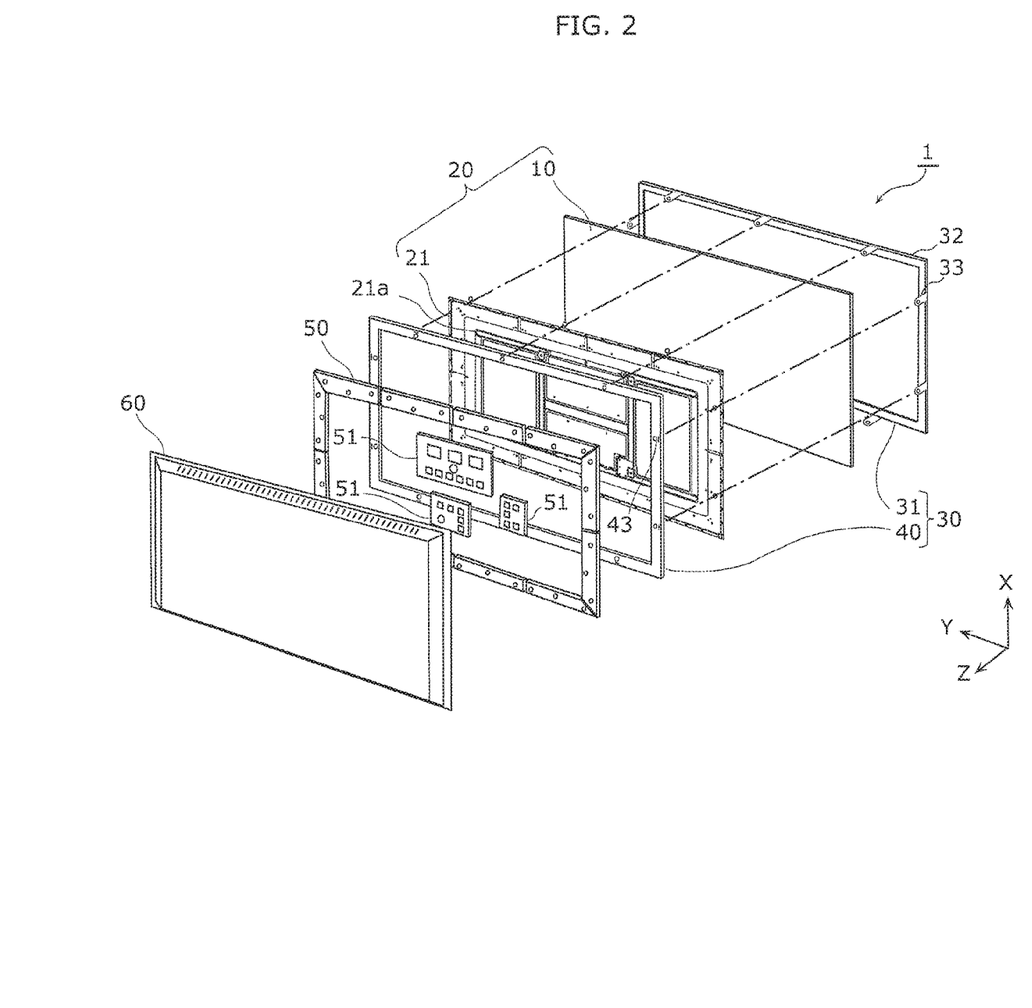
FIG. 2 is an exploded perspective view of the image display apparatus according to the embodiment.

FIG. 2 is an exploded perspective view of the image display apparatus 1 according to the embodiment.

As illustrated in FIGS. 1 and 2, the image display apparatus 1 according to the present embodiment includes a display unit 20 and a first frame member 31.

The display unit 20 includes a display panel 10 which displays an image on a front face, and a chassis 21 disposed on a back face of the display panel 10 and holding the display panel 10.

In the present embodiment, an organic EL display panel is employed as the display panel 10. The organic EL display panel is a self-emissive display panel having a configuration in which organic EL elements are disposed between two glass substrates, and does not need backlight, as required by a liquid crystal display panel. Accordingly, a thin organic EL display panel having a thickness of about 1 mm to 3 mm, for example, can be achieved.

The first frame member 31 is a member disposed along at least a portion of a front periphery of the display panel 10. In other words, the first frame member 31 is a member attached to the display unit 20 as a frame disposed along the front periphery of the display panel 10, and is produced by, for example, processing a metal plate, such as an aluminum plate. Furthermore, in the present embodiment, a frame member 30 which holds the periphery of the display unit 20 includes the first frame member 31 and a second frame member 40.

The first frame member 31 includes a front portion 32 disposed on the front face of the display panel 10, and a folding portion 33 connected to the front portion 32, and having an end portion which is disposed at a back face side of the chassis 21 by being bent, the end portion being on a distal end portion relative to the front portion 32.

In the present embodiment, the first frame member 31 is a ring-shaped member disposed along the entire front periphery of the display panel 10, and includes a plurality of the folding portions 33.

More specifically, the first frame member 31 is a rectangular ring-shaped member disposed along the four sides of the rectangular display panel 10 in front view. At least one of the folding portions 33 (two or more folding portions 33 in the present embodiment) is included in the first frame member 31 at each of portions corresponding to the four sides of the display panel 10.

The second frame member 40 has slits (attachment holes 43) through which the folding portions 33 pass. The folding portions 33 included in the first frame member 31 are bent in a state where the folding portions 33 pass through the attachment holes 43 of the second frame member 40. In this manner, the first frame member 31 is attached to the display unit 20.

Details of the frame member 30 (the first frame member 31 and the second frame member 40) and a structure in which the frame member 30 is attached to the display unit 20, for instance, are later described with reference to FIGS. 6 to 9.

In the present embodiment, the image display apparatus 1 further includes circuit boards 50 and circuit boards 51 disposed on the back face of the chassis 21, and a back cover 60 covering the back face of the chassis 21.

Each of the circuit boards 50 is a drive circuit board on which a drive circuit (driver) which supplies a signal voltage to the EL panel 10. The circuit boards 50 are disposed along the periphery the chassis 21 on the back face, and at the same time, connected to the display panel 10 via flexible cables.

The circuit boards 51 are attached in a predetermined region (center portion) which includes the center of the back face of the chassis 21. Electronic circuits included in the circuit boards 51 include a signal processing circuit which processes a received video signal, a control circuit which controls operation of a scan drive circuit and a signal line drive circuit, and a power supply circuit which receives power from the outside and supplies the power to the circuits.

Note that although the image display apparatus 1 includes other elements which are not illustrated in FIG. 2, such as the flexible cables which connect the display panel 10 and the circuit boards 50, the illustration and description of such other elements are omitted in order to clearly show features of the image display apparatus 1 according to the present disclosure.

The chassis 21 is a metal member, for example, and has a protrusion 21a projecting from the side opposite the display panel 10. Thus, in short, the chassis 21 is shaped such that the protrusion 21a is formed on the planar body.

The chassis 21 according to the present embodiment is a member formed by performing a pressing process, such as a raising process, on a rectangular metal sheet member (metal plate) made of aluminum or iron, to form the protrusion 21a.

At least the center and peripheral portions of the chassis 21 are regions in which no protrusion 21a is formed, and since the circuit boards 50 and 51 are disposed in such regions, the thicknesses of the circuit boards 50 and 51 have no or little Influence on the thickness of the image display apparatus 1.

The image display apparatus 1 having such a configuration is achieved as, for example, a television receiver (television) which outputs video signals and audio signals that are obtained from, for instance, received broadcast waves.

The following describes a basic configuration of the display panel 10 included in the image display apparatus 1 having a configuration as described above, with reference to FIGS. 3 to 5.

1-2. Display Panel

Figure 3:
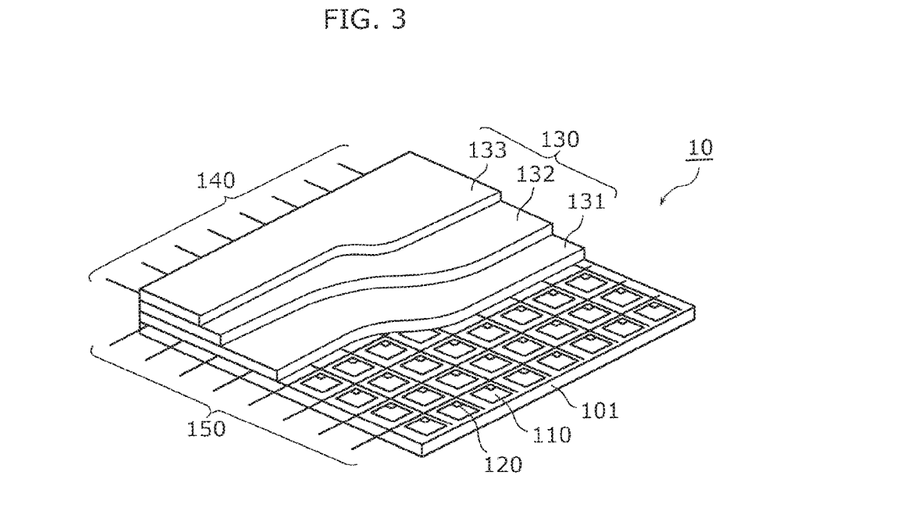
FIG. 3 is a partial cutaway perspective view of a display panel according to the embodiment.

FIG. 3 is a partial cutaway perspective view of the display panel 10 according to the embodiment.

Figure 4:
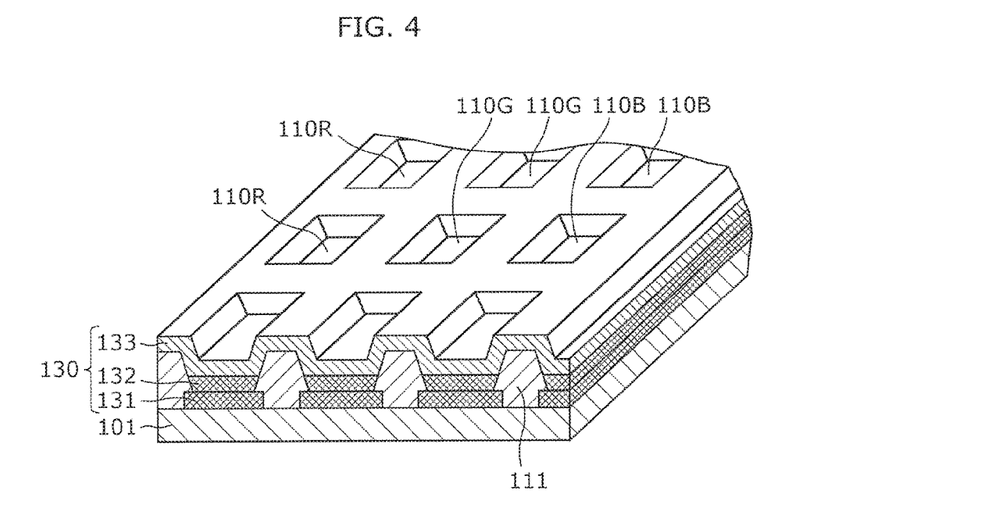
FIG. 4 is a perspective view illustrating examples of pixel banks of the display panel according to the embodiment.

FIG. 4 is a perspective view illustrating examples of pixel banks of the display panel 10 according to the embodiment.

As illustrated in FIG. 3, the display panel 10 has a structure in which organic EL elements (light emitting units) 130 and a TFT substrate (TFT array substrate) 101 which includes a plurality of thin-film transistors disposed are stacked. The organic EL elements 130 each include an anode 131 which is a lower electrode, an EL layer 132 which is a light emitting layer that includes organic material, and a cathode 133 which is a transparent upper electrode.

Note that although the display panel 10 includes a glass substrate disposed over the organic EL elements 130, illustration of the glass substrate is omitted from FIGS. 3 and 4.

The TFT substrate 101 has a structure in which various elements, such as a gate electrode, are stacked above a glass substrate, for example. Specifically, the display panel 10 has a structure in which the organic EL elements 130, for instance, are between the two glass substrates, as a whole. The thickness of the display panel 10 having such a structure is about 1 mm to 3 mm, for example.

A plurality of pixels 110 are disposed in matrix form on the TFT substrate 101, and each pixel 110 includes a pixel circuit 120.

The organic EL elements 130 are formed in one-to-one correspondence with the plurality of pixels 110, and the pixel circuits 120 of the pixels 110 control light emission of the organic EL elements 130. The organic EL elements 130 are formed on an interlayer insulation film (flattening film) formed so as to cover the plurality of thin-film transistors.

In addition, the organic EL elements 130 each have a structure in which the EL layer 132 is disposed between the anode 131 and the cathode 133. A positive hole transport layer is further formed and stacked between the anode 131 and the EL layer 132, and an electron transport layer is further formed and stacked between the EL layer 132 and the cathode 133. Note that another organic functional layer may be provided between the anode 131 and the cathode 133.

The pixel circuits 120 control the drive of the pixels 110. In addition, a plurality of gate lines (scanning lines) 140 disposed in the row direction of the pixels 110, a plurality of source lines (signal lines) 150 disposed in the column direction of the pixels 110 so as to intersect the gate lines 140, and a plurality of power supply lines (omitted in FIG. 3) disposed parallel to the source lines 150b are formed on the TFT substrate 101. The pixels 110 are separated by the gate lines 140 and the source lines 150 which are orthogonal to one another, for example.

The gate lines 140 are connected to, row-by-row, gate electrodes of thin-film transistors which operate as switching elements included in the pixel circuits 120. The source lines 150 are connected to, column-by-column, source electrodes of the thin-film transistors which operate as switching elements included in the pixel circuits 120. The power supply lines are connected to, column-by-column, drain electrodes of the thin-film transistors which operate as driver elements included in the pixel circuits 120.

As illustrated in FIG. 4, the pixels 110 of the display panel 10 each include sub pixels 110R, 110G, and 110B of three colors (red, green, blue). The sub pixels 110R, 110G, and 110B are disposed in matrix form on the display surface.

The sub pixels 110R, 110G, and 110B are separated from one another by banks 111. The banks 111 are formed to make a lattice such that protruding lines extending parallel to the gate lines 140 and protruding lines extending parallel to the source lines 150 intersect with one another. Portions surrounded by the protruding lines (in other words, openings of the banks 111) and the sub pixels 110R, 110G, and 110B are in one-to-one correspondence. Note that although the banks 111 are pixel banks in the present embodiment, the banks 111 may be line banks.

The anode 131 is formed for each of the sub pixels 110R and 110G and 110B, on the interlayer insulation film (flattening film) on the TFT substrate 101 and inside the openings of the banks 111. Similarly, the EL layer 132 is formed for the sub pixels 110R and 110G and 110B, on the anode 131 and inside the openings of the banks 111. The transparent cathode 133 is formed in a connected manner above the banks 111 so as to cover the entire EL layer 132 (all the sub pixels 110R, 110G, and 110B).

Furthermore, the pixel circuits 120 are provided in one-to-one correspondence with the sub pixels 110R, 110G, and 110B, and the sub pixels 110R, 110G, and 110B and the pixel circuits 120 in one-to-one correspondence therewith are electrically connected by contact holes and relay electrodes. Note that the sub pixels 110R, 110G, and 110B have the same configurations, except that the portions of the EL layer 132 emit light in different colors.

Figure 5:
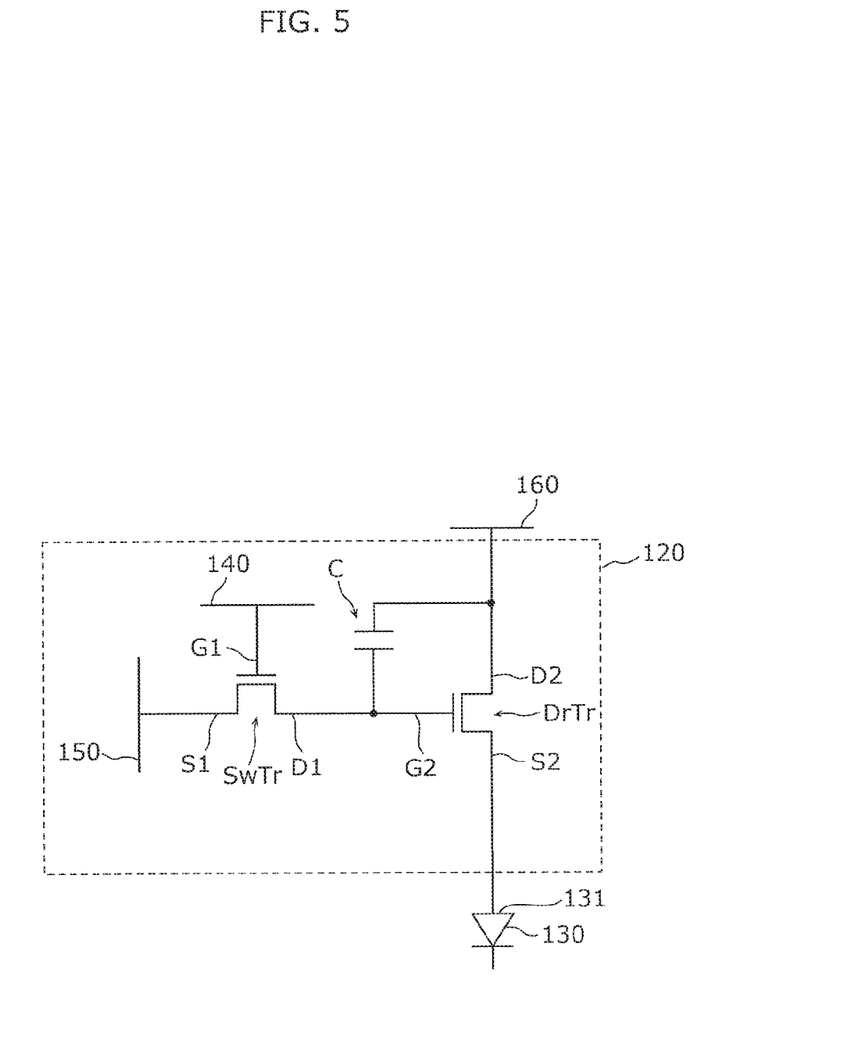
FIG. 5 is an electrical diagram illustrating a configuration of a pixel circuit of the display panel according to the embodiment.

Here, a description of a circuit configuration of the pixel circuits 120 of the pixels 110 is given with reference to FIG. 5. FIG. 5 is an electrical diagram illustrating the configuration of the pixel circuits 120 in the display panel 10 according to the embodiment.

As illustrated in FIG. 5, each pixel circuit 120 includes a thin-film transistor SwTr which operates as a switching element, a thin-film transistor DrTr which operates as a driver element, and a capacitor C which stores data to be displayed using the corresponding pixel 110. In the present embodiment, the thin-film transistor SwTr is a switching transistor for selecting a pixel 110, and the thin-film transistor DrTr is a drive transistor for driving the organic EL element 130.

The thin-film transistor SwTr includes a gate electrode G1 connected to the gate line 140, a source electrode S1 connected to the source line 150, a drain electrode D1 connected to a capacitor C and a gate electrode G2 of the thin-film transistor DrTr, and a semiconductor film (not illustrated). If a predetermined voltage is applied to the gate line 140 and the source line 150 which are connected to the thin-film transistor SwTr, the voltage applied to the source line 150 is stored as a data voltage into the capacitor C.

The thin-film transistor DrTr includes the gate electrode G2 connected to the drain electrode D1 of the thin-film transistor SwTr and the capacitor C, a drain electrode D2 connected to a power supply line 160 and the capacitor C, a source electrode S2 connected to the anode 131 of the organic EL element 130, and a semiconductor film (not illustrated). The thin-film transistor DrTr supplies, from the power supply line 160 to the anode 131 of the organic EL element 130 via the source electrode S2, a current corresponding to the data voltage stored in the capacitor C. Accordingly, a drive current flows from the anode 131 to the cathode 133 in the organic EL element 130, thus causing the EL layer 132 to emit light.

Note that the active matrix for controlling display for each of the pixels 110 located at the intersections of the gate lines 140 and the source lines 150 is employed for the organic EL panel 10 having the above configuration. In this manner, the thin-film transistors SwTr and DrTr of each of the pixels 110 (the sub pixels 110R, 110G, and 110B) cause the corresponding organic EL element 130 to selectively emit light, thus displaying a desired image.

The following describes, for instance, details of the frame member 30 (the first frame member 31 and the second frame member 40) according to the embodiment a structure in which the frame member 30 is attached to the display unit 20, with reference to FIGS. 6 to 9.

1-3. Frame Member

Figure 6:
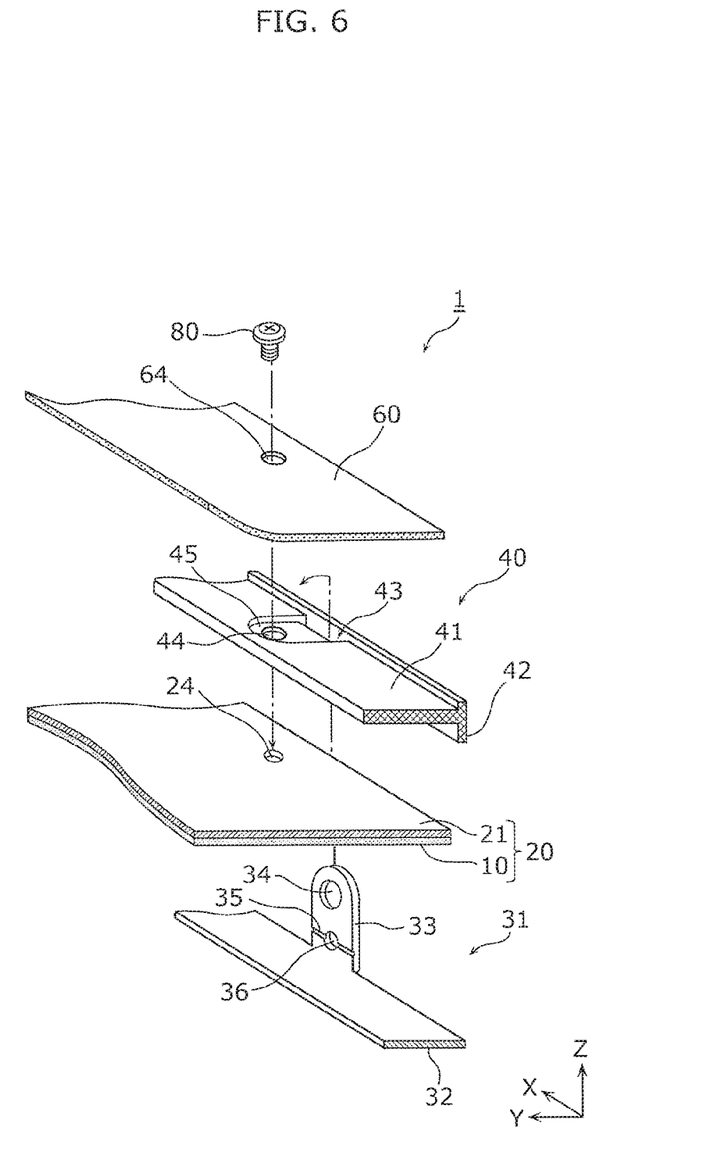
FIG. 6 is a first exploded perspective view illustrating a portion of a structure of the image display apparatus according to the embodiment.
Figure 7:
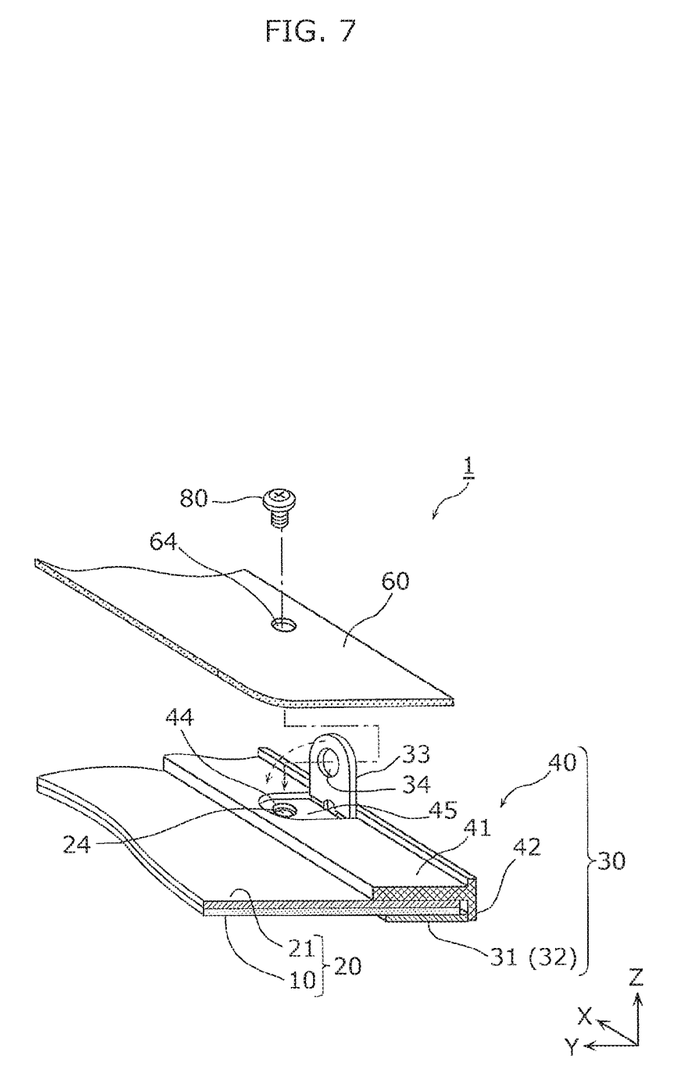
FIG. 7 is a second exploded perspective view illustrating the portion of the structure of the image display apparatus according to the embodiment.

FIG. 6 is a first exploded perspective view illustrating a portion of a structure of the image display apparatus 1 according to the embodiment, and FIG. 7 is a second exploded perspective view illustrating the structure thereof.

Figure 8:
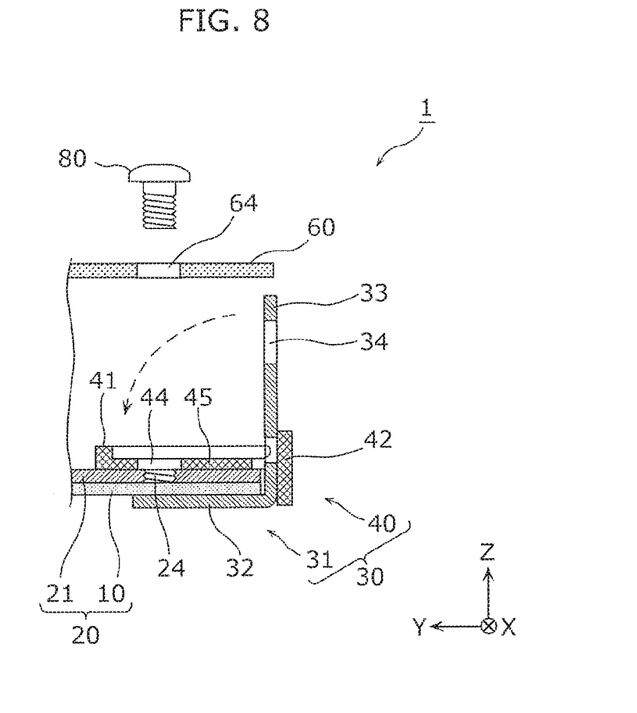
FIG. 8 is a partial cross sectional view corresponding to FIG. 7.
Figure 9:
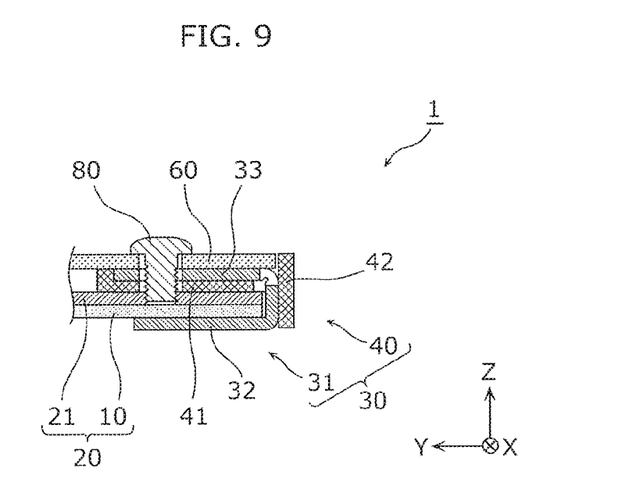
FIG. 9 is a partial cross sectional view illustrating a state where a folding portion is bent and a back cover is attached.

FIG. 8 is a partial cross sectional view corresponding to FIG. 7, and FIG. 9 is a partial cross sectional view illustrating a state in which the folding portion 33 is bent and the back cover 60 is attached. Specifically, FIGS. 8 and 9 illustrate a cross section of the folding portion 33 parallel to the YZ plane at a middle position in the X axis direction. The same applies to FIGS. 10 and 11 later described.

Note that FIGS. 6 to 9 illustrate portions cut from the image display apparatus 1 in order to illustrate a schematic structure surrounding one folding portion 33 of the image display apparatus 1. The following describes, focusing on one folding portion 33, a structure surrounding the folding portion 33. Yet, the following description also applies to each of the folding portions 33.

The illustration of the circuit boards 50 is omitted from FIGS. 6 to 9. This also applies to FIGS. 10, 11, and 13 described below.

As illustrated in FIGS. 6 to 9, the first frame member 31 includes the folding portion 33 projecting from an edge portion of the front portion 32 toward the display unit 20.

By the folding portion 33 being bent toward the back face of the chassis 21, the first frame member 31 is disposed at the display unit 20, sandwiching an edge of the display unit 20.

In other words, the manufacture of the image display apparatus 1 includes: disposing the front portion 32 of the first frame member 31 on the front face of the display panel 10; and bending the folding portion 33 toward the back face of the chassis 21 in a state where the front portion 32 is disposed on the front face of the display panel 10.

Specifically, the folding portion 33 of the first frame member 31 is inserted in the attachment hole 43 of the second frame member 40 (refer to FIGS. 6 to 8), and thereafter, the folding portion 33 is bent toward the back face of the chassis 21 (refer to FIG. 9).

In the present embodiment, a groove 35 and a through hole 36 are formed in the folding portion 33 at a position close to the front portion 32. Accordingly, a position at which the folding portion 33 is bent is limited to an appropriate position and furthermore, the bending work is readily conducted. In addition, the front portion 32 is prevented from being deformed due to the stress generated when the folding portion 33 is bent.

Note that for example, if the folding portion 33 in a bent state is raised in order to carry out maintenance of the image display apparatus 1 such as a repair, it is assumed that the bend of the folding portion 33 may be weakened or broken. In such a case, the first frame member 31 is replaced with a new first frame member 31.

The second frame member 40 includes a back portion 41 positioned opposite the front portion 32, and the attachment hole 43 is formed in the back portion 41. A recess 45 for accommodating the folding portion 33 inserted in the attachment hole 43 and bent is formed in the back portion 41.

Since the folding portion 33 in a bent state is accommodated in the recess 45, the folding portion 33 is prevented from projecting from the outer face (a face on the back cover 60 side) of the back portion 41.

This increases the contact area of the second frame member 40 and a peripheral portion of the back cover 60, for example. As a result, a foreign substance such as dust and dirt is prevented from entering the image display apparatus 1 from the gap between the back cover 60 and the second frame member 40, and also the effect of reducing unnecessary radiation can be achieved.

Note that in the present embodiment, the folding portion 33 is screwed to the chassis 21 (fastened with a screw 80), in a bent state. Specifically, in a state where the screw 80 passes through a screw hole 64 of the back cover 60, a screw hole 34 of the folding portion 33, and a screw hole 44 of the second frame member 40, the screw 80 engages a screw hole 24 of the chassis 21, which has an inner surface in which a thread groove is formed.

In other words, the back cover 60 is fastened to the chassis 21 with the screw 80, along with the folding portion 33 and the second frame member 40.

The second frame member 40 further includes a side portion 42 disposed further outward than the attachment hole 43 and covering a portion of the folding portion 33.

In the present embodiment, for example, as Illustrated in FIG. 8, the side portion 42 has a width (length in the Z axis direction) which does not allow the side portion 42 from projecting further outward (in the negative direction of the Z-axis) than the outer face of the front portion 32 (which is on the side opposite the display panel 10). Accordingly, this avoids marring the appearance of the image display apparatus 1, and also allows the folding portion 33 to be concealed.

Note that in the present embodiment, the first frame member 31 is a ring-shaped member disposed along the entire front periphery of the display panel 10, and includes the plurality of folding portions 33. The second frame member 40 has the attachment holes 43 in positions corresponding to the plurality of folding portions 33.

Thus, at the time of producing the image display apparatus 1, a process of inserting the folding portions 33 to the attachment holes 43 can be executed simultaneously. Furthermore, a subsequent process of bending the folding portions 33 can also be executed simultaneously.

1-4. Advantageous Effects and Others

As described above, the image display apparatus 1 according to the present embodiment includes the display unit 20 and the first frame member 31. The display unit 20 includes the display panel 10 and the chassis 21. The first frame member 31 includes the front portion 32 disposed on the front periphery of the display panel 10, and the folding portion 33 connected to the front portion 32. The folding portion 33 is bent toward the back face of the chassis 21 in a state where the front portion 32 is disposed on the display panel 10.

In other words, in the image display apparatus 1 according to the present embodiment, the first frame member 31 that functions as a frame of the display panel 10 can be attached to the display panel 10 by bending a thin-plate shaped member (the folding portion 33) extending from the front portion 32 backward (in the positive direction of the Z-axis, refer to FIG. 6, for example). Accordingly, it is unnecessary to dispose an element such as a screw or a boss, on an outer edge of the display panel 10.

In this manner, the width (for example, the length in the Y axis direction in FIG. 6) of the first frame member 31 can be shortened. Thus, according to the image display apparatus 1, a slim frame can be achieved more readily than a conventional apparatus.

As a result, for example, while the first frame member 31 is functioning as a member protecting the periphery of the display panel 10, a frame area which is an obstacle to viewing can be made smaller than that of a conventional apparatus (a proportion of the image display area in a front view of the image display apparatus 1 can be increased).

The folding portion 33 can be bent in a state where the front portion 32 is in direct contact with the front face of the display panel 10 or is in contact therewith via a spacer or the like. In other words, the first frame member 31 can be attached to the display panel 10 so as not to generate a gap between the front portion 32 and the front face of the display panel 10.

In this manner, for example, a foreign substance is prevented from entering the image display apparatus 1 from a gap between the front portion 32 and the front face of the display panel 10. For example, the degree of direct or indirect contact between the front portion 32 and the front face of the display panel 10 increases, and thus the efficiency of heat conduction from the display panel 10 to the first frame member 31 improves. As a result, the effect of dissipating heat generated by the display panel 10 via the first frame member 31 also improves.

Note that in the present embodiment, an organic EL display panel is employed as the display panel 10. Thus, even if bending (crimping) the folding portion 33 causes the front portion 32 to press the display face (front face) of the display panel 10, the pressure applied by the front portion 32 gives less influence to image display quality, compared to the case where the display panel 10 is, for example, a liquid crystal display panel.

The image display apparatus 1 according to the present embodiment further includes the second frame member 40, and the second frame member 40 includes the back portion 41 positioned opposite the front portion 32, with the display unit 20 in between. The folding portion 33 of the first frame member 31 is bent in a state where the folding portion 33 passes through the attachment hole 43 formed in the second frame member 40.

Thus, a peripheral portion of the display unit 20 is stably held, being sandwiched between the first frame member 31 and the second frame member 40 from the front and the back. The crimping force generated by the folding portion 33 being bent can be used for this holding, and thus stable holding can be readily achieved.

In the present embodiment, the attachment hole 43 is formed in the back portion 41, and the second frame member 40 further includes the side portion 42 disposed further outward than the attachment hole 43 and covering at least a portion of the folding portion 33.

In other words, the second frame member 40 is caused to function as a structure for holding the display unit 20, and simultaneously as a member which conceals the folding portion 33. Furthermore, the side portion 42 also yields, for example, an effect of preventing a foreign substance such as dust and dirt from entering the inside of the image display apparatus 1 from the side of the display panel 10.

In the present embodiment, the folding portion 33 is fastened to the chassis 21 with the screw 80, in a bent state. This reliably fixes the first frame member 31 to the display unit 20.

The image display apparatus 1 according to the present embodiment further includes the back cover 60 covering the back face of the chassis 21, and the back cover 60 is fastened to the chassis 21 with the screw 80, along with the folding portion 33.

As described above, such a single screw 80 fixes the back cover 60 to the display unit 20 and also fixes the frame member 30 (the first frame member 31 and the second frame member 40) to the display unit 20, thus reducing the number of components of the image display apparatus 1.

In the present embodiment, the frame member 30 which covers a peripheral portion of the display unit 20 includes the first frame member 31 and the second frame member 40 which are attached to the display unit 20, sandwiching the display unit 20 from the front and the back, as described above.

Accordingly, the first frame member 31 can be formed as a ring-shaped member disposed along the entire front periphery of the display panel 10. More specifically, in the present embodiment, the display panel 10 is rectangular in front view, and the first frame member 31 is a rectangular ring-shaped member disposed along four sides of the display panel 10. Furthermore, at least one of the folding portions 33 is included in the first frame member 31 at each of portions corresponding to the four sides.

As described above, the first frame member 31 does not need to be achieved by a combination of a plurality of members, and can be achieved by a single member. This yields, for example, an improvement in the manufacturing efficiency of the image display apparatus 1 and an effect such as simplification of management of parts.

Furthermore, the same also applies to the second frame member 40, and the second frame member 40 can also be achieved as a single member, rather than a combination of a plurality of members.

Note that a structure other than the structure illustrated in FIGS. 6 to 9 may be employed as a structure for the first frame member 31 and/or the second frame member 40 of the image display apparatus 1.

In view of this, the following describes various variations of the structure of the first frame member 31 and/or the second frame member 40 which the image display apparatus 1 may adopt, focusing on differences from the above embodiment.

2-1. Variation 1

Figure 10:
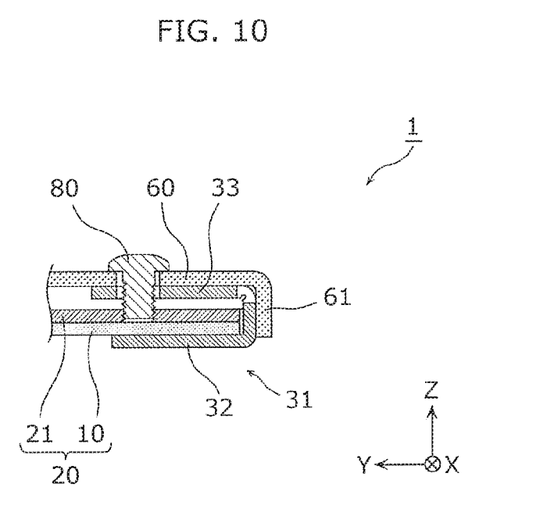
FIG. 10 is a partial cross sectional view illustrating a structure in which a first frame member is attached according to Variation 1 of the embodiment.

FIG. 10 is a partial cross sectional view illustrating a structure in which the first frame member 31 is attached according to Variation 1 of the embodiment.

The image display apparatus 1 according to Variation 1 illustrated in FIG. 10 does not include the second frame member 40, unlike the image display apparatus according to the above embodiment.

In other words, the folding portion 33 of the first frame member 31 is fastened to the display unit 20 (the chassis 21) with the screw 80, without passing through the second frame member 40.

Even in this case, the first frame member 31 included in the frame of the display panel 10 can be attached to the display panel 10.

Note that in this case, the back cover 60 may have a side portion 61 which conceals the folding portion 33 as Illustrated in, for example, FIG. 10. In other words, the image display apparatus 1 may include the back cover 60 covering the back face of the chassis 21 and the folding portion 33 of the first frame member 31.

Although FIG. 10 illustrates that the folding portion 33 is fastened to the chassis 21 with the screw 80 in a state where the folding portion 33 is not in contact with the chassis 21, the folding portion 33 and the chassis 21 may be fastened with the screw 80 in a state where the folding portion 33 is in contact with the chassis 21. For example, the folding portion 33 may have a projecting portion, and the folding portion 33 is bent such that the projecting portion is in contact with the chassis 21. In this state, the folding portion 33 may be fixed to the chassis 21 with the screw 80.

The folding portion 33 is bent with, for example, a flexible member such as a heat-resistant rubber sheet being sandwiched between the folding portions 33 and the chassis 21, and may be fixed to the chassis 21 with the screw 80 in this state.

As described above, the folding portion 33 is screwed, being in direct or indirect contact with the back face of the chassis 21, thus improving the stability of fixation of the first frame member 31 to the chassis 21 (the display unit 20).

2-2. Variation 2

Figure 11:
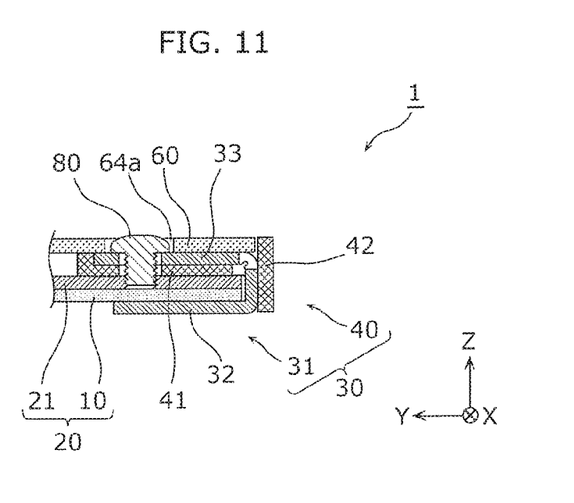
FIG. 11 is a partial cross sectional view illustrating a structure in which the first frame member is attached according to Variation 2 of the embodiment.

FIG. 11 is a partial cross sectional view illustrating a structure in which the first frame member 31 is attached, according to Variation 2 of the embodiment.

In the image display apparatus 1 according to Variation 2 illustrated in FIG. 11, the back cover 60 is not fastened to the chassis 21 with the screw 80, which is a difference from the above embodiment.

Specifically, the back cover 60 has a screw hole 64a having an inside diameter greater than the outside diameter of the head of the screw 80. In this manner, when the screw 80 engages the screw hole 24 of the chassis 21 (for example, refer to FIG. 8), the head of the screw 80 is accommodated in the screw hole 64a. In other words, the screw 80 fastens the folding portion 33 and the back portion 41 (the second frame member 40) to the chassis 21, in a state where the head of the screw 80 is in direct contact with the folding portion 33.

In this case, the back cover 60 may be fastened to the chassis 21 with a screw for fixing the back cover 60, for example. Furthermore, for example, the back cover 60 may include a hook which engages an opening or a hollow provided in the side portion 42 of the second frame member 40, and thus the back cover 60 may be attached to the display unit 20.

As described above, the back cover 60 includes the screw hole 64a having a size which accommodates the head of the screw 80, and thus an amount of the head of the screw 80 projecting from the back cover 60 can be reduced.

2-3. Variation 3

Figure 12:
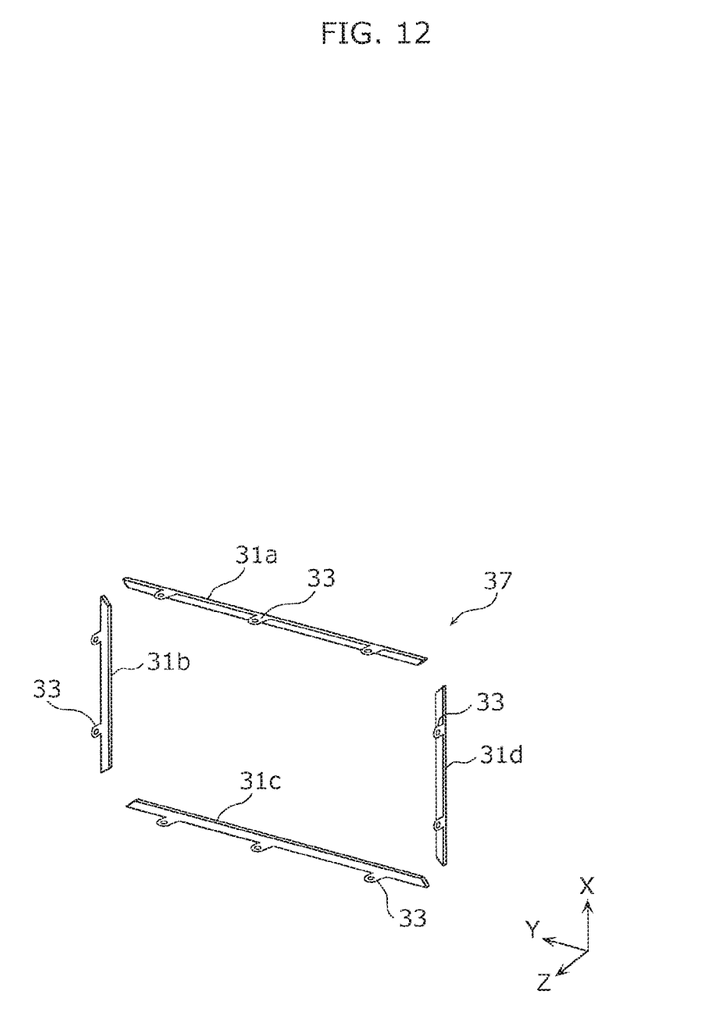
FIG. 12 is a perspective view illustrating an example of a configuration of the first frame member according to Variation 3 of the embodiment.

FIG. 12 is a perspective view illustrating an example of a configuration of a first frame member 37 according to Variation 3 of the embodiment.

The first frame member 37 according to Variation 3 illustrated in FIG. 12 includes a combination of a plurality of members, unlike the first frame member 31 according to the above embodiment.

Specifically, the first frame member 37 includes first frame members 31a and 31c disposed along two long sides of the display panel 10 (for example, refer to FIG. 2) and first frame members 31b and 31d disposed along two short sides of the display panel 10. In other words, four partial members (the first frame members 31a to 31d) are included in the first frame member 37 which is a ring-shaped member disposed along the entire front periphery of the display panel 10.

Note that in this case, the first frame members 31a and 31c have an axisymmetric structure parallel to the Y axis in FIG. 12. Accordingly, by producing 2N components of one type (N is an integer of one or more), N first frame member(s) 31a and N first frame member(s) 31c are obtained.

Furthermore, the same applies to the first frame members 31b and 31d, and the first frame members 31b and 31d have an axisymmetric structure parallel to the X axis in FIG. 12. Accordingly, by producing 2N components of one type, N first frame member(s) 31b and N first frame member(s) 31d are obtained.

Note that in this variation, the first frame member 37 includes four members (the first frame members 31a to 31d), yet a total number of members included in the first frame member 37 is not particularly limited.

In this manner, since the first frame member 37 which covers the entire front periphery of the display panel 10 includes a plurality of members (the first frame members 31a to 31d), the first frame member 37 as a component is more readily handled, for example.

For example, as described above, if the folding portion 33 in a bent state is raised in order to carry out maintenance of the image display apparatus 1 such as a repair, it is assumed that the bend of the folding portion 33 may be weakened or broken. In such a case, just one of the first frame members 31a to 31d that has such a folding portion 33 may be replaced with a new member. This contributes to a reduction in cost for the maintenance of the image display apparatus 1, for example.

2-4. Variation 4

Figure 13:
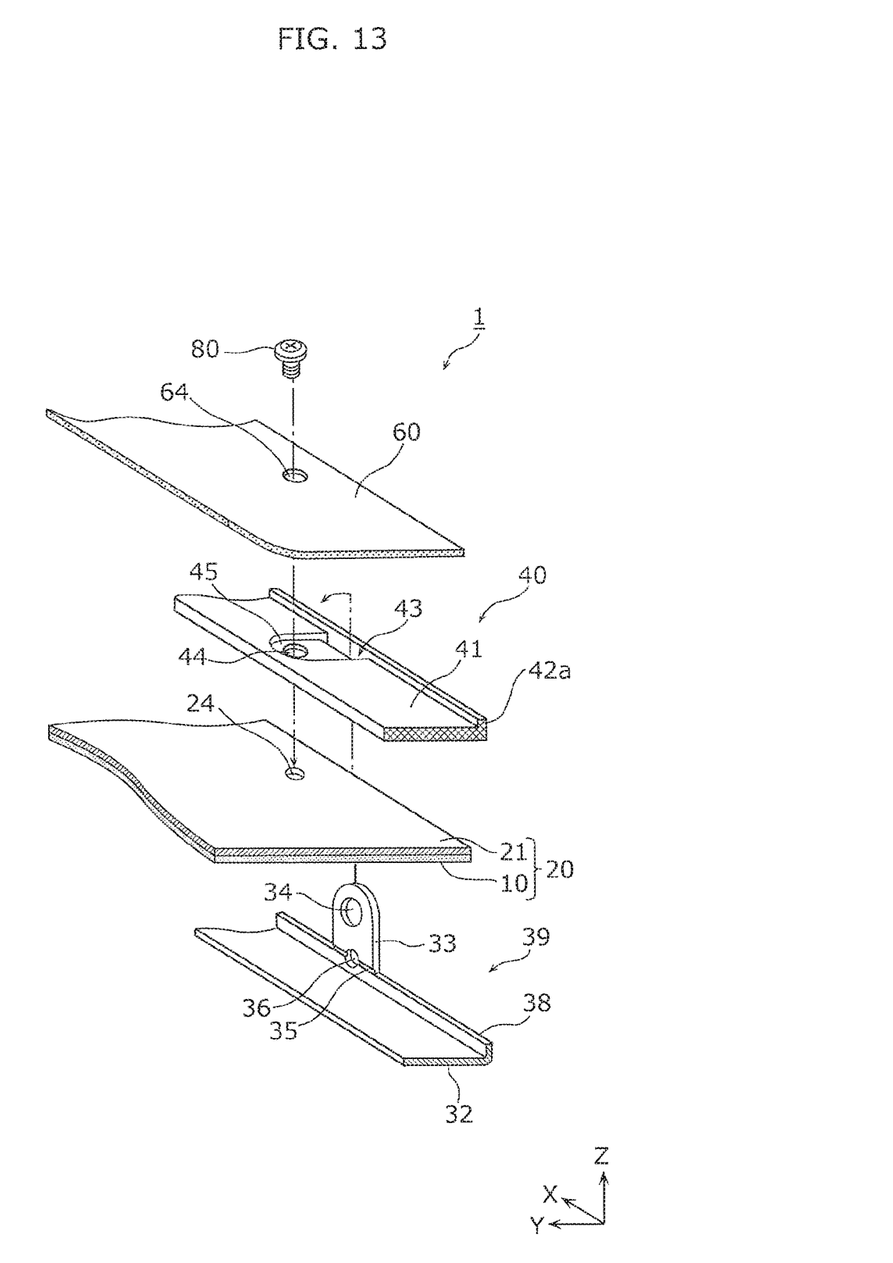
FIG. 13 is an exploded perspective view illustrating a portion of a structure of the image display apparatus according to Variation 4 of the embodiment.

FIG. 13 is an exploded perspective view illustrating a portion of a structure of the image display apparatus 1 according to Variation 4 of the embodiment.

A first frame member 39 according to Variation 4 illustrated in FIG. 13 includes the folding portion 33 as with the first frame member 31 according to the above embodiment. By the folding portion 33 being bent, an end portion of the folding portion 33, which is a distal end portion relative to the front portion 32, is disposed at a back face side of the chassis 21.

However, the first frame member 39 includes a side portion 38 disposed along an edge face of the display unit 20, unlike the first frame member 31 according to the above embodiment.

A side portion 42a of the second frame member 40 according to this variation does not have a portion extending along the side of the display unit 20, which is a difference from the second frame member 40 according to the above embodiment which includes the side portion 42 (for example, refer to FIG. 6).

In other words, in this variation, the side portion 38 of the first frame member 39 and the side portion 42a of the second frame member 40 form a side face covering an outer edge of the display unit 20.

Note that in this case, for example, a flexible member such as a rubber member may be disposed between the side portion 38 and the second frame member 40 so as to prevent a gap from being generated between the side portion 38 and the second frame member 40.

The second frame member 40 may not have the side portion 42a. In this case, if, for example, the back cover 60 includes the side portion 61 (refer to FIG. 10), the side portion 61 can conceal the folding portion 33 and a boundary portion between the first frame member 39 and the second frame member 40.

The second frame member 40 may have the side portion 42 according to the embodiment, instead of the side portion 42a. In this case, the side portion 42 can completely conceal the bent (root) of the folding portion 33. Furthermore, the edge face of the display unit 20 is covered doubly by the side portion 38 of the first frame member 31 and the side portion 42 of the second frame member 40. Thus, for example, a foreign substance is more reliably prevented from entering the image display apparatus 1 from the gap between the first frame member 31 and the second frame member 40.

Here, the front portion 32 and the side portion 38 of the first frame member 39 is formed by, for example, pressing a single sheet metal, and the side portion 38 functions as a rib provided along the long side of the front portion 32.

In other words, since the first frame member 39 includes the side portion 38, the strength of the first frame member 39 improves, and as a result, the strength of the image display apparatus 1 also improves.

3. Other Embodiments

The above has described the embodiment and the variations thereof as examples of the technology disclosed in this application. However, the technology according to the present disclosure is not limited to these, and is also applicable to embodiments as a result of making change, replacement, addition, and omission as appropriate. Furthermore, elements described in the above embodiment and the variations can be combined to achieve a new embodiment. The following describes other embodiments as examples.

For example, the first frame member 31 according to the embodiment includes the front portion 32 and the folding portion 33 that are achieved as a single component, yet the front portion 32 and the folding portion 33 may be separate components.

For example, the first frame member 31 may include the front portion 32 whose material is resin and the folding portion 33 made of metal and attached to the front portion 32. In this case, the front portion 32 and the folding portion 33 may be joined by insert molding.

For example, the back cover 60 may include the side portion 61 (refer to FIG. 10) covering, from the outer side, the side portion 42 (refer to FIG. 9) of the second frame member 40.

The type of the display panel 10 included in the image display apparatus 1 is not limited to an organic EL display panel. For example, a liquid crystal display panel or a plasma display panel may be employed as the display panel 10.

In either case, a slim frame is achieved by attaching the first frame member 31 (37, 39) which includes the folding portion 33.

It is not necessary to use the screw 80 to attach the first frame member 31 to the display unit 20. As described in the present embodiment, if the first frame member 31 is a ring-shaped member, the first frame member 31 can be substantially fixed to the display unit 20 by bending the plurality of folding portions 33 disposed on the edges of the display unit 20 toward the back face of the chassis 21.

The above has described embodiments as examples of the technology according to the present disclosure. For the description, the accompanying drawings and the detailed description are provided.

Thus, the elements illustrated in the accompanying drawings and described in the detailed description may include not only elements necessary for addressing the problem, but also elements not necessarily required for addressing the problem, in order to illustrate the above technology. Accordingly, a mere fact that such unnecessarily required elements are illustrated in the accompanying drawings and described in the detailed description should not immediately lead to a determination that such unnecessarily required elements are required.

In addition, the embodiments described above are intended to illustrate the technology according to the present disclosure, and thus various changes, replacement, addition, and omission, for instance, can be performed within the scope of claims and equivalent thereof.

INDUSTRIAL APPLICABILITY

The present disclosure is useful to, for example, an image display apparatus for which a demand for a slim frame is made, and is applicable to image display apparatuses such as television receivers, monitor displays, digital signage, mobile terminals, tablet terminals, and table type displays.

The invention claimed is:

1. An image display apparatus comprising:
a display which includes a display panel that displays an image on a front face, and a chassis disposed on a back face of the display panel and holding the display panel; and
a first frame member disposed along at least a portion of a front periphery of the display panel, wherein
the first frame member includes:
a front portion disposed on the front face of the display panel; and
a folding portion connected to the front portion and configured to be in a first position and a second position,
wherein the folding portion in the first position
is disposed perpendicular to the front portion,
extends towards a second frame member, and
passes through an opening on the second frame member, and
wherein the folding portion in the second position
is disposed to be parallel to the front portion, and
has an end portion of the folding portion disposed on a back face side of the chassis to secure the first frame to the display, the end portion being a distal end portion relative to the front portion.

2. The image display apparatus according to claim 1, further comprising
a second frame member which includes a back portion positioned opposite the front portion of the first frame member, with the display disposed between the back portion and the front portion, wherein
the folding portion of the first frame member is bent in a state where the folding portion passes through an attachment hole provided in the second frame member.

3. The image display apparatus according to claim 2, wherein
the attachment hole is provided in the back portion, and
the second frame member further includes a side portion disposed further outward than the attachment hole and covers at least a portion of the folding portion.

4. The image display apparatus according to claim 1, wherein
the folding portion is fastened to the chassis with a screw, in a bent state.

5. The image display apparatus according to claim 4, further comprising
a back cover covering the back face of the chassis, wherein the back cover is fastened to the chassis with the screw, along with the folding portion.

6. The image display apparatus according to claim 1, wherein
the first frame member is a ring-shaped member disposed along an entirety of the front periphery of the display panel, and includes a plurality of folding portions.

7. The image display apparatus according to claim 6, wherein
the display panel is rectangular in front view,
the first frame member is a rectangular ring-shaped member disposed along four sides of the display panel, and
at least one of the plurality of folding portions is included in the first frame member at each of portions corresponding to the four sides.

8. The image display apparatus according to claim 1, further comprising
a back cover covering the back face of the chassis and the folding portion of the first frame member.

9. The image display apparatus according to claim 1, wherein
the display panel is an organic electroluminescent (EL) display panel.

10. A method for manufacturing an image display apparatus which includes: a display which includes a display panel that displays an image on a front face, and a chassis disposed on a back face of the display panel and holding the display panel; and a first frame member disposed along at least a portion of a front periphery of the display panel and including a front portion and a folding portion connected to the front portion, the folding portion configured to be in a first position and a second position, the method comprising:
disposing the front portion on the front face of the display panel; and
bending the folding portion from the first position to the second position in a direction toward a back face of the chassis, in a state where the front portion is disposed on the front face of the display panel,
wherein the folding portion in the first position
is disposed perpendicular to the front portion,
extends towards a second frame member, and
passes through an opening on the second frame member, and
wherein the folding portion in the second position
is disposed to be parallel to the front portion, and
has an end portion of the folding portion disposed on the back face side of the chassis to secure the first frame to the display, the end portion being a distal end portion relative to the front portion.

\* \* \* \* \*